United States Patent [19]
Toi et al.

[11] Patent Number: 6,027,008
[45] Date of Patent: Feb. 22, 2000

[54] ELECTRONIC DEVICE HAVING ELECTRIC WIRES AND METHOD OF PRODUCING SAME

[75] Inventors: Takaomi Toi, Sabae; Tetsuya Morinaga, Fukui; Masahiro Bando, Sabae; Tetsuo Hatakenaka, Takefu; Kazuo Kasahara, Sabae; Koki Sasaki, Fukui; Takayuki Hirotsuji, Fukui-ken, all of Japan

[73] Assignee: Murata Manufacturing Co., Ltd., Japan

[21] Appl. No.: 09/076,549

[22] Filed: May 12, 1998

[30]  Foreign Application Priority Data

May 14, 1997  [JP]  Japan .................................... 9-124102
Mar. 27, 1998  [JP]  Japan .................................... 10-081780

[51] Int. Cl.[7] .......................... H05K 3/34; H01L 21/603; H01L 21/607
[52] U.S. Cl. .................................. 228/110.1; 228/111.5; 228/173.2; 228/265; 228/180.5
[58] Field of Search .............................. 228/110.1, 111.5, 228/179.1, 180.5, 173.2, 265, 1.1, 4.5

[56] References Cited

U.S. PATENT DOCUMENTS

| | | | |
|---|---|---|---|
| 3,672,047 | 6/1972 | Sakamoto et al. | 29/854 |
| 3,733,685 | 5/1973 | Kauppila | 228/110.1 |
| 4,752,266 | 6/1988 | Vrijssen | 445/44 |
| 4,907,734 | 3/1990 | Conru et al. | 228/123.1 |
| 4,948,030 | 8/1990 | Chason et al. | 228/118 |
| 5,495,976 | 3/1996 | Mironesco et al. | 228/110.1 |

*Primary Examiner*—Samuel M. Heinrich
*Attorney, Agent, or Firm*—Graham & James LLP

[57] ABSTRACT

An electronic device such as a chip coil including an electric wire firmly connected to electrodes in a highly reliable fashion is constructed to be mounted on a printed circuit board or substrate in a stable and reliable manner. At both ends of a core of the chip coil, there are provided electrodes having a multilayer structure including a high-conductivity layer made of Ag, Ag—Pd, or a similar material; a solder barrier layer made of Ni; and an easy-soldering layer made of Sn or solder. End portions of the electric wire are embedded in the easy-soldering layer so that the resultant electrode structure has a substantially flat surface. A thermocompression process is performed so that the end portions of the electric wire are connected to the solder barrier layer via solid welding and to the easy-soldering layer via brazing.

4 Claims, 10 Drawing Sheets

ELECTRONIC DEVICE HAVING ELECTRIC WIRES AND METHOD OF PRODUCING SAME

BACKGROUND OF THE INVENTION

1. Field of the Invention

The present invention relates to an electronic device having electric wires such as a wire-wound chip coil and to a method of producing such a coil device. The present invention also relates to a method of producing an electronic device having electric wires in an inductance component. More particularly, the present invention relates to a method of producing an electronic device having electric wires including an improved process of connecting end portions of an insulated electric wire wound around a core to electrodes located on the core.

2. Description of the Related Art

FIG. 5 illustrates a conventional chip coil made up of an electric wire 5 wound around a core 1 made of a magnetic material, wherein ends 5a of the wire 5 are connected, via thermo-compression bonding such as a wire bonding process, to respective electrodes 2 located on the core 1. The electrodes 2 are made of a material such as Ag or Ag—Pd. When the ends 5a of the wire are connected to the respective electrodes 2, the resultant connecting portions of the wire 5 have raised portions bulging from the surface of the electrodes 2. The bulging shape of the connecting portions causes the chip coil to become unstable when it is mounted on a printed circuit board. That is, the chip coil is mounted unevenly in a slanted orientation or topples over and is separated from the printed circuit board in the worst case. Another problem with the chip coil of this type is that the ends 5a of the wire 5 are exposed directly to air and thus, the ends of the wire are oxidized. This makes it difficult to solder the ends of the wire during the process of mounting the chip coil.

One possible technique of improving the stability of the mounted position is to form recesses 3 as seen in FIG. 6 in both end portions of the core 1 so that the ends 5a of the wire can be placed inside the recesses 3. However, the shape of the core 1 becomes complicated and difficult processes are required to produce such a complicated structure including the recesses 3.

The insulated electric wire 5 generally consists of an electric wire made of metal such as copper whose outer surface is coated with an insulating material such as polyesterimide. The insulated electric wire is connected to the electrodes via, for example, pulse heating. The connection process via pulse heating is described below with reference to FIG. 11.

In FIG. 11, cross sections of the core 51 of the coil device and the electrode 52 located on the upper surface of the core 51 are shown. An end portion of the insulated electric wire 53 is disposed on the electrode 52.

A pressing tip 56 heated at about 500° C. is moved down so that the insulated electric wire 53 is pressed against the electrode 52. The electric wire 53a is flattened by the pressure and the electric wire 53a is connected to the electrode 52 via thermo-compression bonding.

In this connection technique, if the electrode 52 is made of metal having a high melting point such as Ag, Cu, or Ni, the insulating coating 53b melts at a temperature lower than the melting point of the electrode 52, and the electric wire 53a and the electrode 52 are directly connected to each other. Another feature of this technique is that the electric wire 53a is flattened by the pressure.

However, although the electric wire 53a on the electrode 52 is flattened, there is still a processing step required on the surface of the electrode 52 and the electric wire 53a. When the coil device is mounted on a printed circuit board such that the surface of the electrode 52 and attached electric wire 53a comes into contact with the printed circuit board, the above-described step can cause the coil device to become unstable or cause the soldered connection to become unreliable.

In many cases, the surface of the electrodes 52 of the coil device is plated with metal having a low melting point such as Sn or solder so that a low-melting-point electrode layer is formed on the electrode 52 thereby ensuring that the electrode can be easily soldered. For example, as shown in FIG. 12, the electrode 52 is produced by coating a silver-filled paste on the surface of the core 51 and baking it so as to form a base layer 52a, then plating the surface of the base layer 52a with Ni thereby forming a Ni-plated layer 52b for protecting the base layer 52a from being eroded by solder, and finally forming an electrode layer 52c of low-melting-point metal which allows the electrode 52 to be easily soldered.

In the case of the coil device having the above structure, when connection is performed with the pressing tip 54 heated at about 500° C., the electrode layer 52c is heated by the pressing tip 54 to a temperature higher than the melting point of the low-melting-point metal. In the connecting process, the electrically conductive wire 53a is pressed by a pressure high enough to compress the electrically conductive wire 53a. As a result, the insulating coating 53b and the electrode layer 52c made of the low-melting-point metal at the top layer are both melted into liquid states, and the electrically conductive wire 53a is compressed into a flattened shape.

As a result, in the pressing process using the pressing tip 54, the low-melting-point metal in the liquid state is pushed aside by the insulating coating 53b in the liquid state toward the sides of the electrically conductive wire 53a. In the above process, after the low-melting-point metal is pushed aside by the melted insulating coating 53b, if the melted insulating coating 53b ticks to the pressing tip 54 and is removed when the pressing tip 54 is moved up to its original position, the Ni-plated layer 52b a sometimes exposed in an area A at a side of the conductive wire 53a. If the Ni-plated layer 52b is partially exposed, when the coil device is mounted on a printed circuit board via soldering, a connection failure can occur because the Ni-plated layer 52b has poor solder wettability.

Even in the case where the Ni-plated layer 52b does not become exposed in the area A in FIG. 12 after the low-melting-point metal is pushed aside by the melted insulating coating 53b, if the melted insulating coating 53b sticks to the pressing tip 54 and is removed when the pressing tip 54 is moved up to its original position, a crater 52d is produced in an area on the surface of the electrode 52 where the insulating coating 53b of the electrically conductive wire 53a was present. If such a crater is produced, it becomes difficult to make a good connection in the soldering process.

SUMMARY OF THE INVENTION

To overcome the problems described above, preferred embodiments of the present invention provide an electronic device including a wire which is mounted in a stable fashion, firmly connected to an electrode and is very resistant to oxidization and a method of producing such an electronic device.

In addition, preferred embodiments of the present invention provide a method of producing a coil device, capable of connecting an insulated electric wire to an electrode for connection to an outer circuit in such a manner that the insulated electric wire is embedded in the electrode thereby ensuring that the coil device can be connected to the outer circuit in a highly reliable fashion without causing a soldering failure or any problem which occurs in the conventional techniques.

According to a preferred embodiment of the present invention, an electronic device includes an electric wire firmly connected to an electrode located on an insulating base, the electrode including at least a solder barrier layer made of a material with a high melting point and an easy-soldering layer made of a material with a low melting point; and the electric wire is embedded via a thermo-compression process in the easy-soldering layer in such a manner that the resultant structure has a substantially flat surface.

In the electronic device according to preferred embodiments of the present invention, the flattened electric wire is embedded in the easy-soldering layer so that the resultant structure of the electrode has a flat surface including no raised portions extending from the electrode. As a result of this structure, the electronic device can be mounted in a stable fashion on a circuit board without causing the electronic device to be slanted or to topple over.

In the electronic device according to preferred embodiments of the present invention, the surfaces of the easy-soldering layer and electric wire are preferably covered with another easy-soldering layer so that the surfaces of the electrodes become flatter and so that the surfaces of the electrodes are protected from being oxidized.

According to another aspect of preferred embodiments of the present invention, there is provided a method of producing an electronic device, including forming an electrode on an insulating base, the electrode including at least a solder barrier layer made of a material with a high melting point and an easy-soldering layer made of a material with a low melting point disposed on the surface of the solder barrier layer; and pressing the electric wire against the electrode while heating the electric wire and the electrode so that the electric wire and the solder barrier layer are connected together via solid welding and so that the electric wire and the easy-soldering layer are connected together via brazing.

In this production method according to preferred embodiments of the invention, the easy-soldering layer is melted via heating and compressed via pressing so that the electric wire sinks into the easy-soldering layer. As a result, the electrode has a structure having a substantially flat surface in which the electric wire and the solder barrier layer are connected to each other via solid welding and the electric wire and the easy-soldering layer are connected to each other via brazing. This technique makes it possible to connect the electric wire to the electrode in a highly reliable manner. In the case where the electric wire is covered with an insulating coating such as polyesterimide, the insulating coating is melted/vaporized via heating in the above production process. Therefore, no additional process for removing the coating is necessary.

In the connection process described above, it is preferable that the electric wire and the electrode be heated so that the temperature thereof increases in a very short period of time to a value higher than the melting point of the easy-soldering layer and lower than the melting point of the solder barrier layer, and then cooled so that the temperature decreases in a very short time to a value lower than the melting point of the easy-soldering layer. Although the time periods of heating, sustaining the elevated temperature, and cooling vary slightly depending on the diameter and material of the electric wire, each time period is preferably set to a value shorter than about a few seconds and more preferably shorter than about 1 second.

According to still another aspect of preferred embodiments of the present invention, there is provided a method of producing a coil device, the coil device including a core made of an insulating material, an insulated electric wire wound around the core, and electrodes disposed on the outer surface of the core, the end portions of the insulated electric wire being connected to the respective electrodes, the method including a low-pressure pressing step in which the insulated electric wire is pressed against the electrodes by a relatively low pressure at a temperature high enough to melt the insulating coating of the insulated electric wire; and a high-pressure pressing step performed following the low-pressure pressing step, in which the electric wire is pressed against the electrode by a relatively high pressure so that the electric wire becomes flat and so that the flattened electric wire is embedded in the electrode.

The temperature in the high-pressure pressing step may be set to a value higher than the melting point of the top portion of the electrode and lower than the freezing point thereof.

The high-pressure pressing step may be performed at a temperature either lower or higher than the temperature at which the low-pressure pressing step is performed.

Preferably, the electrode of the coil device includes a base layer preferably formed via coating and baking an electrically conductive paste such as a silver-filled paste, a solder barrier layer disposed on the surface of the base layer using a metal material such as Ni having high resistance to erosion by solder, and an easy-soldering layer disposed on the outer surface of the solder barrier layer using a metal material such as Sn or solder which is easy to solder.

DETAILED DESCRIPTION OF PREFERRED EMBODIMENTS

The electronic device and the production method according to preferred embodiments of the present invention are described below with reference to preferred embodiments in conjunction with the accompanying drawings.

Figure 1A:
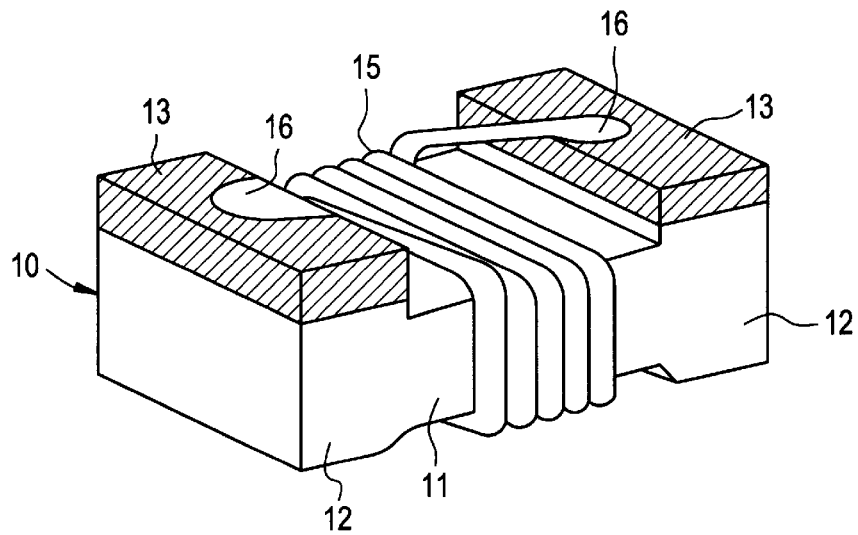
FIG. 1A is a perspective view of a first preferred embodiment of a chip coil according to the present invention.
Figure 1B:
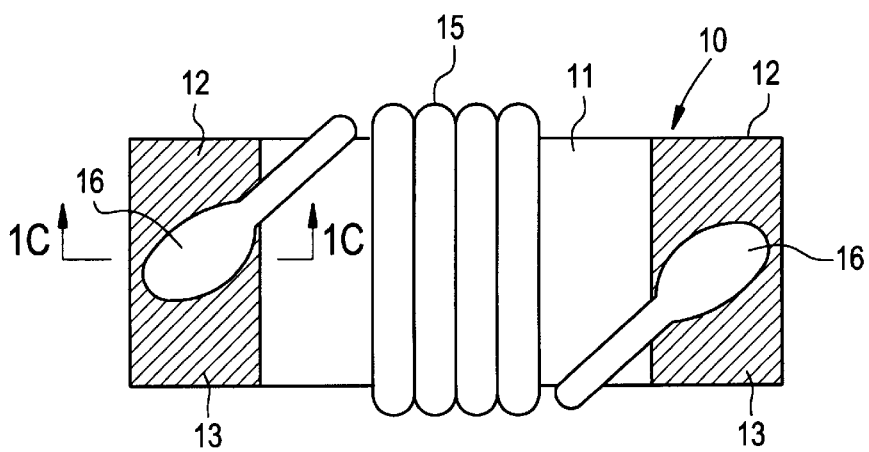
FIG. 1B is a plan view of the preferred embodiment of the chip coil shown in FIG. 1A.

FIG. 1 illustrates a first preferred embodiment of a chip coil according to the present invention. In this chip coil, an electric wire 15 is wound around the main portion 11 of a ceramic core 10, and end portions 16 of the wire 15 are firmly connected, preferably via thermo-compression bonding, to electrodes 13 located on raised portions 12 at both ends of the core 10.

Figure 1C:
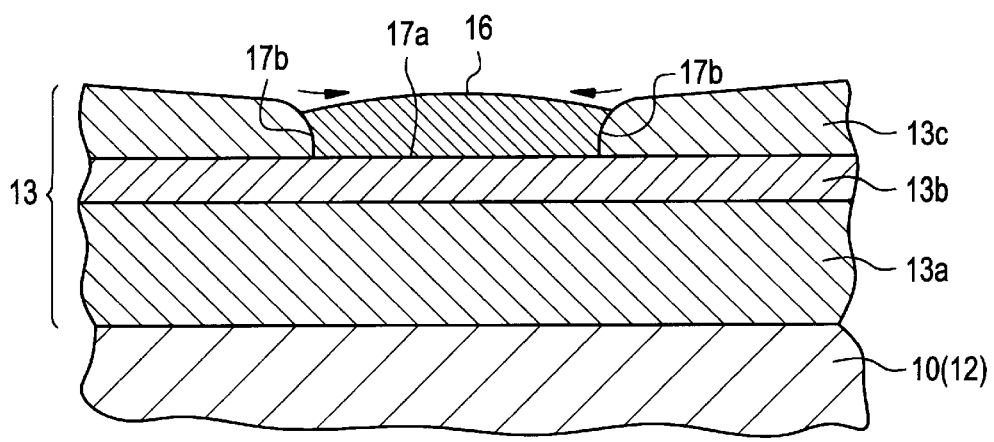
FIG. 1C is a cross-sectional view taken along line C—C in FIG. 1B.

As shown in FIG. 1C, each electrode 13 is preferably formed as follows. First, a high-conductivity material such as Ag or Ag—Pd is coated on the core 10 and baking is performed thereby forming a high-conductivity layer 13a. The surface of the high-conductivity layer 13a is electroplated with Ni so as to form a solder barrier layer 13b. Furthermore, the surface of the solder barrier layer 13b is electroplated with Sn or solder so as to form an easy-soldering layer 13c.

The wire 15 is preferably made of a conductor of Cu with a diameter of about 20 to about 60 μm and is preferably covered with an insulating material such as polyesterimide. The end portions 16 of the wire 15 are connected, preferably via thermo-compression, to the respective electrodes 13 in an embedded arrangement as seen in FIG. 1C.

The process of connecting the wire 15 to the electrodes 13 is described below.

Figure 2A:
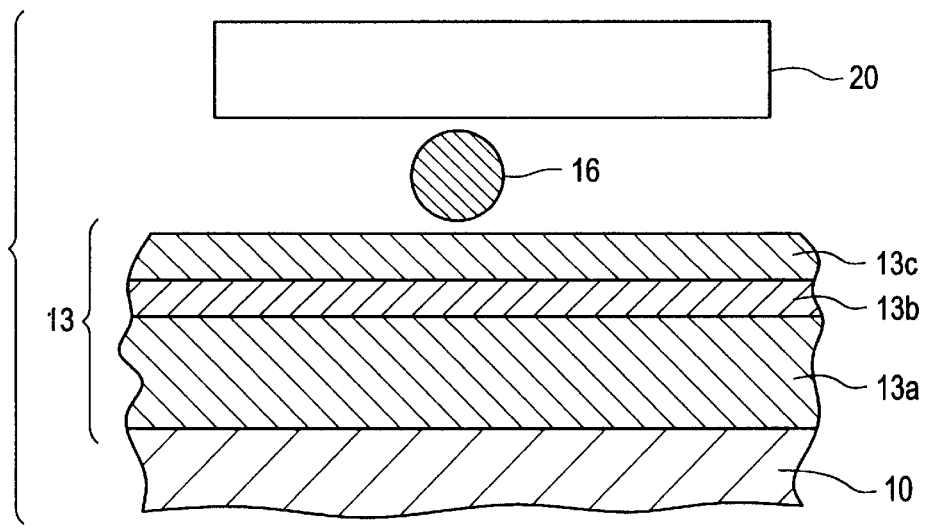
FIG. 2A is a cross-sectional view illustrating an example of a production method according to a preferred embodiment of the present invention in a state immediately before a thermo-compression process.
Figure 2B:
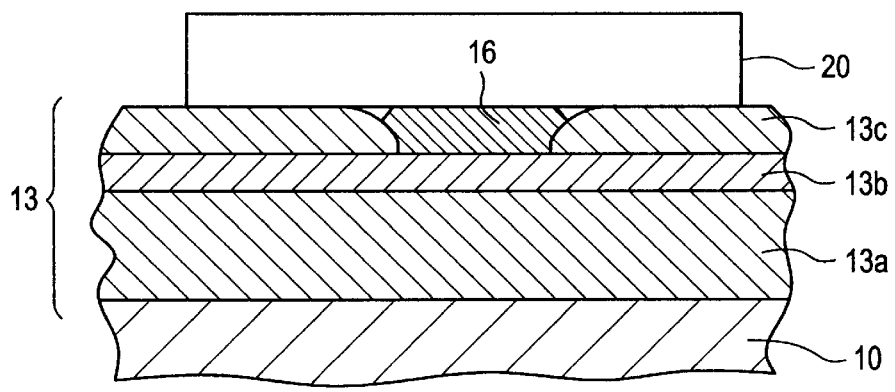
FIG. 2B is a cross-sectional view of the process shown in FIG. 2A in a state during the thermo-compression process.

As shown in FIG. 2A, the end portions 16 of the wire are placed on the respective electrodes 13 and pressed from above by a heater 20 so that the end portions 16 are heated by the heater 20. The pressing and heating are preferably performed at the same time for both end portions 16 of the wire. In a short period of time, for example, less than about 1 sec, the temperature of the heater 20 is increased to a value higher than the melting point of the easy-soldering layer 13c (the melting point of Sn is 231° C. and that of solder is 183° C.) and lower than the melting point of the solder barrier layer 13b (the melting point of Ni is 1455° C.), and more preferably, to a temperature higher than 500° C. The temperature is maintained at this value for about 1 sec or for a shorter time period. The temperature of the heater 20 is decreased quickly in a short period of time, preferably less than about 1 sec to a value lower than the melting point of the easy-soldering layer 13c. Then the heater 20 is moved away from end portions 16 of the wire. For example, a pulse heating heater may be used as the heater 20. With this type of heater, heating can be performed by supplying a pulse current while precisely controlling the heating and pressing conditions. The melting points of Cu and Ag are 1083° C. and 960.5° C., respectively.

Instead of pulse heating, ultrasonic wave radiation may be used to perform the above heating process.

In the connecting process described above, the insulating coating of the end portions 16 of the wire is melted/vaporized by heat. The surface of the end portions 16 of the wire melts and becomes soft. The easy-soldering layer 13c also melts. The end portions 16 of the wire are flattened by the pressure and sink into the easy-soldering layer 13c (see to FIG. 1C). In this state, the end portions 16 of the wire and the solder barrier layer 13b are connected to each other at a contact plane 17a via solid-phase welding, and the end portions 16 of the wire and the easy-soldering layer 13c are connected to each other at a contact plane 17b via brazing.

After completion of the connecting process, the electrode has a structure in which the end portion 16 of the electric wire and the easy-soldering layer 13c become substantially flush and thus, there is no raised portion of the wire extending up from the electrode 13. This structure makes it possible to mount the chip coil on a printed circuit board in a stable fashion without the chip coil being slanted or being prone to topple over or to be removed from the printed circuit board. Furthermore, because the end portions 16 of the electric wire are connected to the electrodes 13 via solid welding and brazing, the connections are highly reliable. Furthermore, the insulating coating of the end portions 16 of the electric wire are removed during the heating process and no additional process or step for removing the coating is necessary. The heating is performed for a very short time so that the insulating coating of the electric wire 15 in the winding part is not damaged.

Figure 3:
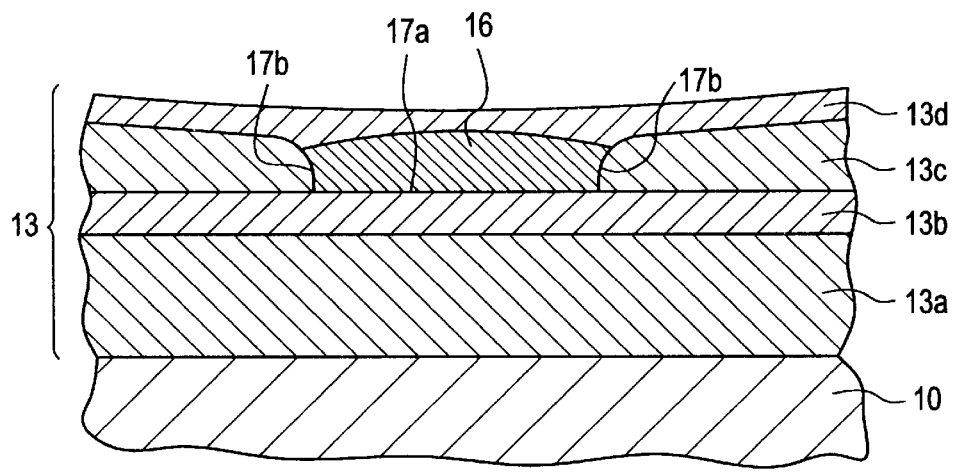
FIG. 3 is a cross-sectional view of the process shown in FIG. 2A illustrating a modification of the first preferred embodiment.

In some cases, as shown in FIG. 1C, the melted easy-soldering layer 13c flows toward the end portions 16 of the electric wire and thus, the end portions 16 of the electric wire are covered by the easy-soldering layer 13c. This results in a further improvement in the flatness of the surface of the electrode 13 and also prevents the end portions 16 of the electric wire from being oxidized. In particular, after completion of the above connecting process, if another easy-soldering layer 13d of Sn or solder is formed via plating or other suitable process on the surface of the electrode 13 as shown in FIG. 3, then the flatness is further improved and the end portions 16 of the electric wire are prevented from being oxidized in a more reliable fashion. In the case where the easy-soldering layer 13d is formed via plating, the size of the end portions 16 of the electric wire are reduced by the plating bath. As a result, the solderability is further improved by the synergistic effects of the presence of the easy-soldering layer 13d and the reduction of the end portions 16 of the wire.

Figure 4A:
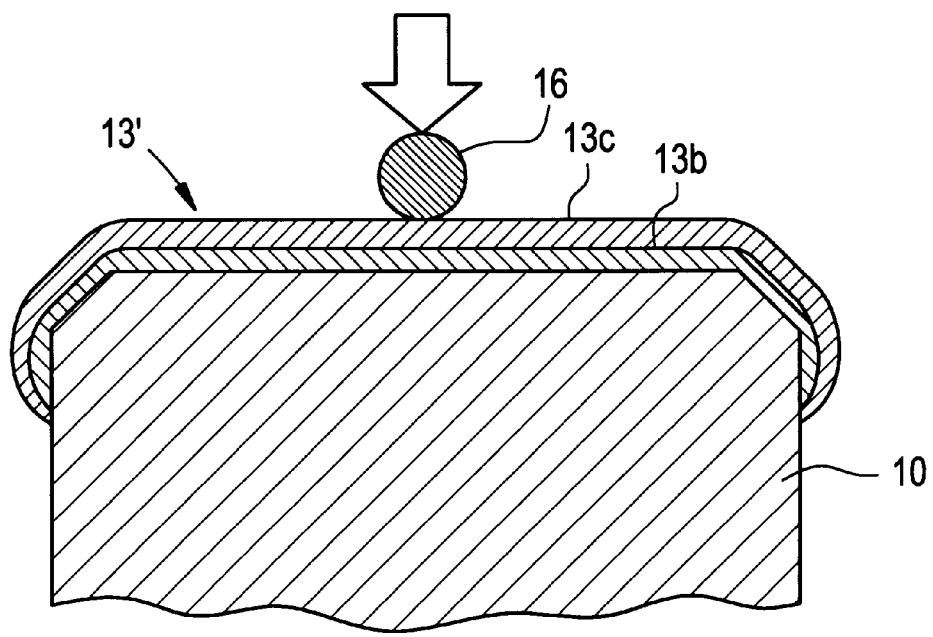
FIG. 4A illustrates a method of producing a chip coil according to a second preferred embodiment of the present invention in a state immediately before a thermo-compression process.
Figure 4B:
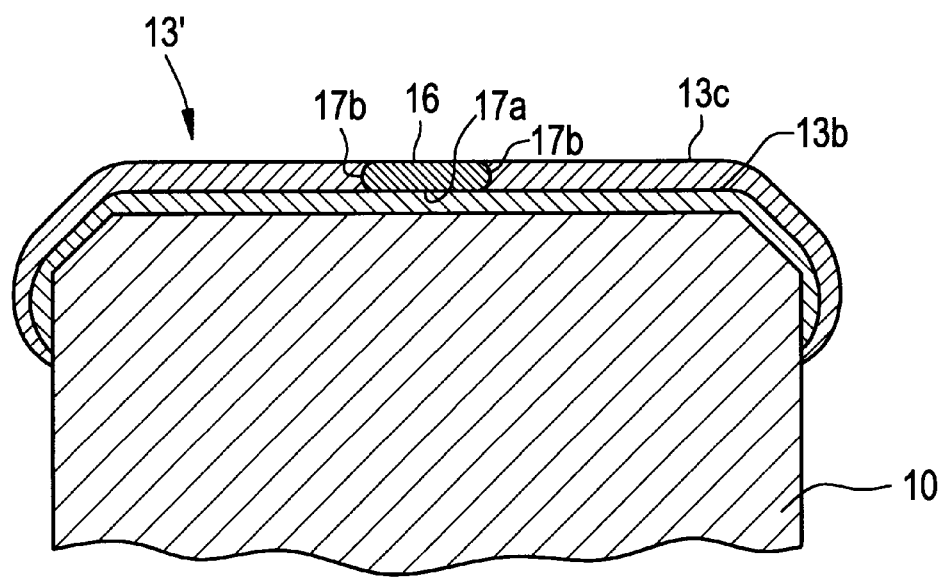
FIG. 4B illustrates the method shown in FIG. 4A in a state immediately after the thermo-compression process.
Figure 5:
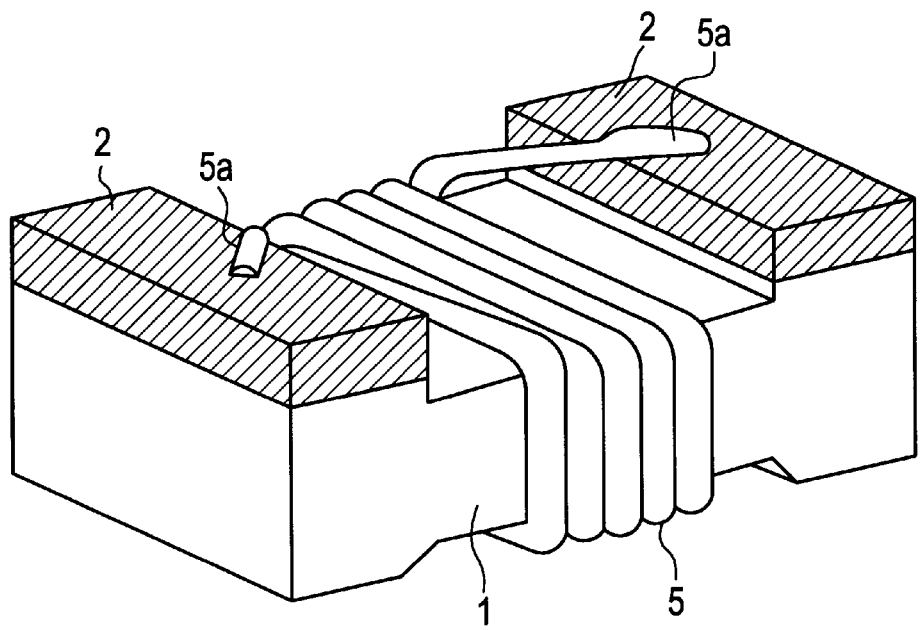
FIG. 5 is a perspective view illustrating an example of a conventional chip coil.
Figure 6:
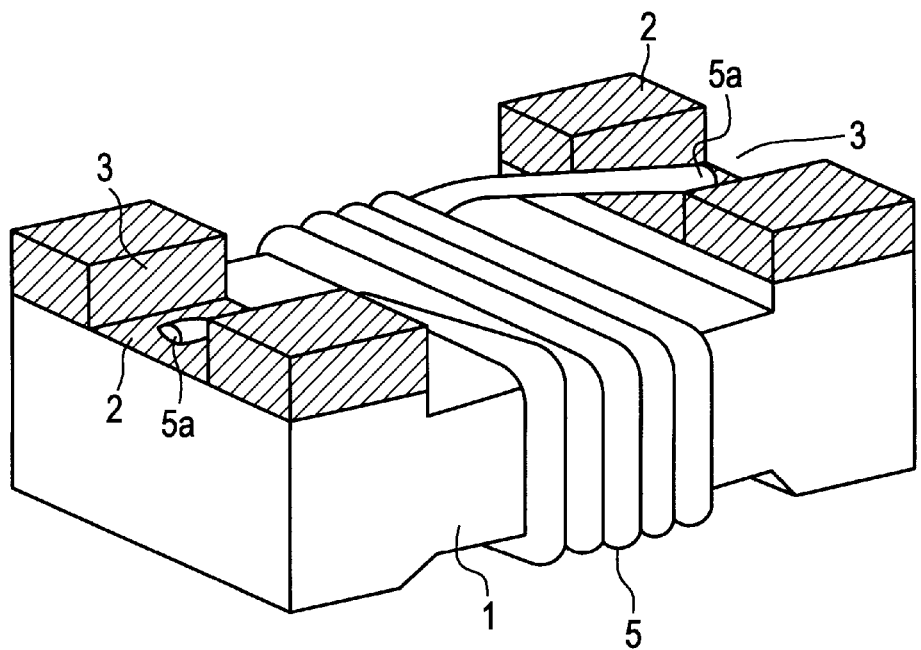
FIG. 6 is a perspective view illustrating another example of a conventional chip coil.

FIG. 4 illustrates a second preferred embodiment of a chip coil according to the present invention. The second preferred embodiment differs from the first preferred embodiment described above in that the electrode 13' disposed on the core 10 has a two-layer structure including of a solder barrier layer 13b made of Ni and an easy-soldering layer 13c made of Sn or solder. The end portions 16 of the electric wire are connected preferably via a thermo-compression bonding process similar to that used in the first preferred embodiment so that the end portions 16 of the electric wire and the solder barrier layer 13b are connected to each other at a connecting plane 17a via solid welding, and the end portions 16 of the electric wire and the easy-soldering layer 13c are connected to each other at a connecting plane 17b via brazing Furthermore, as in the first preferred embodiment, the end portions 16 of the electric wire are connected to the electrodes in an embedded arrangement so that the resultant structure has a flat surface. After completion of the connecting process described above, the surface of the resultant electrode structure may be covered with another easy-soldering layer made of Sn or solder.

FIGS. 7A–7D are cross-sectional views illustrating the process of producing a coil device according to a third preferred embodiment of the present invention. FIG. 8 is a perspective view of the coil device made by the production method according to the third preferred embodiment of the present invention.

First, the structure of the chip type coil device shown in FIG. 8 is described below.

The chip type coil device 31 includes a core 32 made of a dielectric material, magnetic material, or an insulating material such as insulating ceramic or plastic. The core 32 includes a winding part 32a around which an insulated electric wire 33 is wound and electrode parts 32b located at both ends of the winding part 32a wherein the electrode parts 32b have a greater thickness than the winding part 32a. First and second electrodes 34 and 35 are disposed on the upper surface of the electrode portions 32b and 32c, respectively, so that electrical connections to external components can be achieved via the first and second electrodes 34 and 35.

The method of producing a coil device, such as the chip type coil device 31 described above, according to the present preferred embodiment of the invention includes a novel process of connecting the insulating wire 33 to the first and second electrodes 34 and 35. The other processes may be accomplished by known techniques. That is, the process of forming the winding part by winding the insulated electric wire 33 around the outer surface of the core 32 and the process of forming the electrodes 34 and 35 on the upper surface of the electrode parts 32b and 32c of the core 32 may be performed using known techniques.

The process of connecting the end portions of the insulated electric wire 33 to the first and second electrodes 34 and 35, which is a novel feature of preferred embodiments of the present invention, is described in detail below. The process for connecting only one end of the insulated electric wire 33 to the first electrode 34 is described for the purpose of simplicity although both end portions are preferably connected according to the novel process described below.

Figure 7:
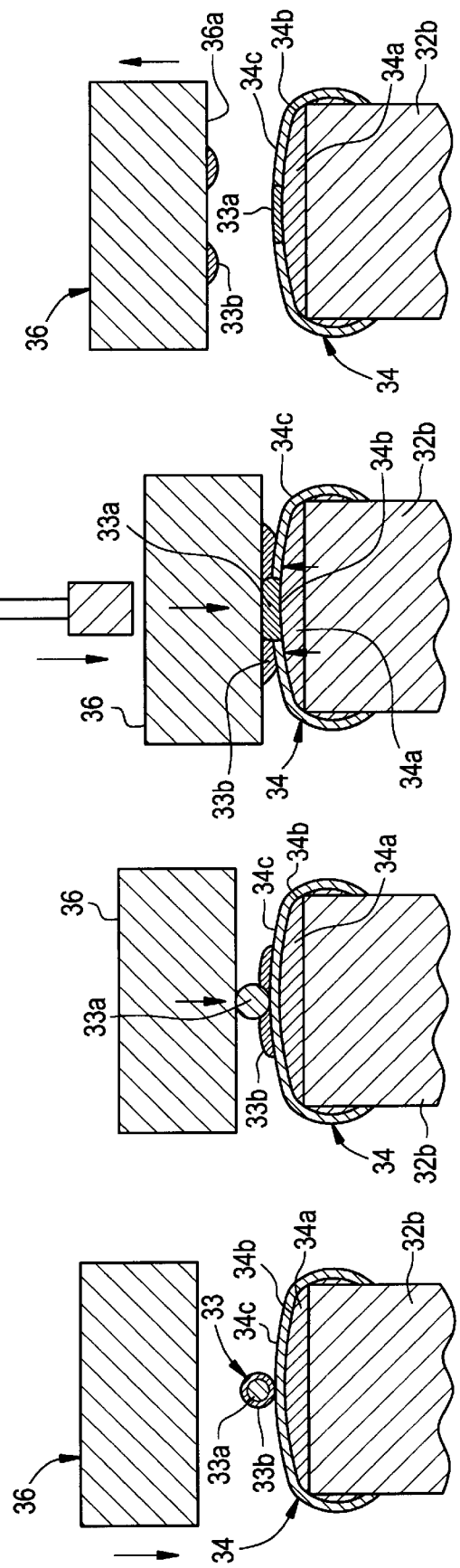
FIG. 7 is a cross-sectional view illustrating the processing steps of connecting an insulated electric wire to a first electrode according to a third preferred embodiment of the invention.
Figure 8:
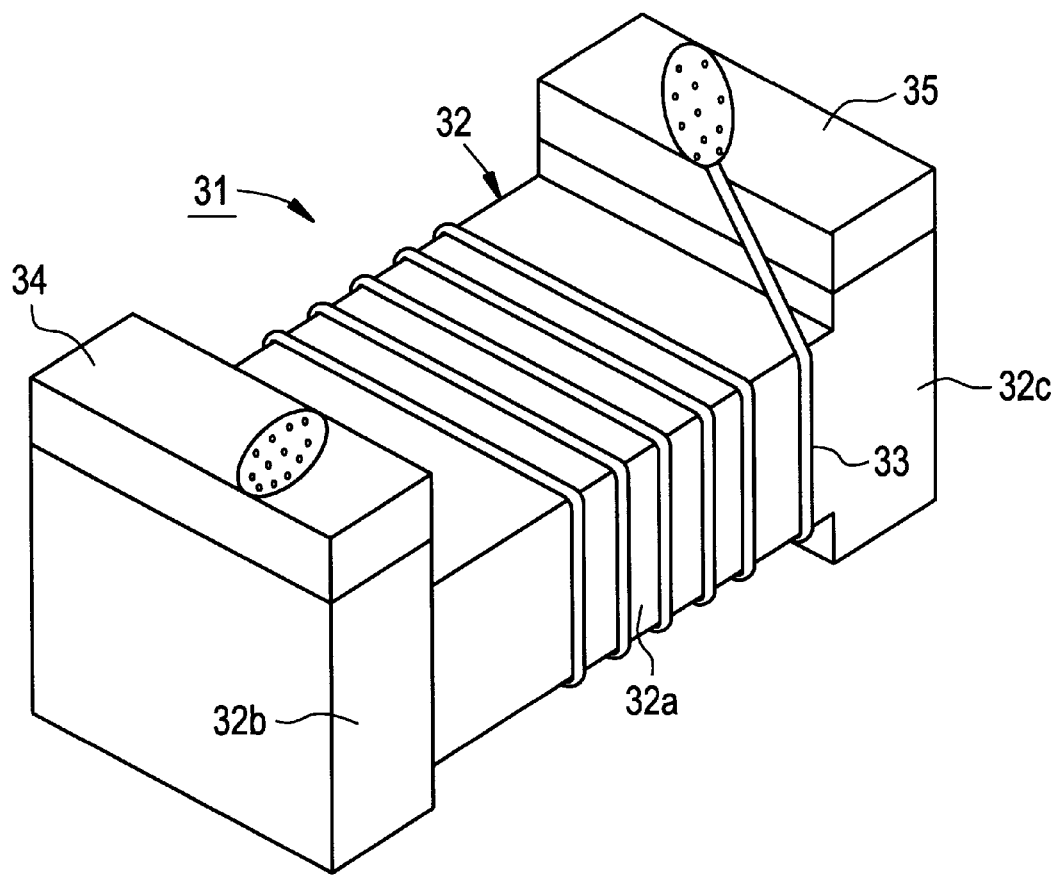
FIG. 8 is a perspective view illustrating a coil device produced by a method according to the third preferred embodiment of the invention.

First, as shown in FIG. 7a, the insulated electric wire 33 is placed on the first electrode 34 located on the upper surface of the electrode part 32b of the core 32 of the coil device. The first electrode 34 preferably has a multilayer structure including of a base layer 34a, a Ni-plated layer 34b, and a Sn-plated layer 34c. The base layer 34a is formed by coating, for example, a silver-filled conductive paste and then baking. Alternatively, the base layer 34a may also be formed via evaporation, plating, sputtering, or other suitable techniques.

The Ni-plated layer 34b disposed on the base layer 34a functions as a solder barrier layer for protecting the base layer 34a from being eroded by solder. Instead of Ni, Cu or Fe may also be used for the same purpose.

The Sn-plated layer 34c disposed on the outer surface of the Ni-plated layer 34b functions as an easy-soldering layer which makes it easy to perform soldering when the coil device is mounted. Instead of Sn, solder or other materials which can be easily soldered may also be used to form the plated layer functioning as the easy-soldering layer.

In the present preferred embodiment, the insulated electric wire 33 includes an electrically conductive wire 33a made of Cu covered with an insulating coating 33b. The insulating coating 33b may be formed using polyesterimide or similar material. When polyesterimide is used to form the insulating coating 33b, it can be melted at a temperature equal to or higher than 330° C.

When the insulated electric wire 33 is connected to the first electrode 34, the insulated electric wire 33 is first placed on the first electrode 34 and a pressing tip 36 is moved down to the wire 33, wherein the pressing tip 36 is heated at a temperature high enough to melt the insulating coating 33b on the electric wire. In this specific preferred embodiment, the tip 36 is preferably heated at about 500° C. or a higher temperature. In the above process, the pressing tip 36 is moved down so that the insulated electric wire 33 is pressed against the first electrode 34 by a relatively low pressure. The optimum pressure in this pressing process depends on the diameter and material of the insulated electric wire 33. In an example in which the insulated electric wire is made of Cu and has a diameter of about 40 μm, the pressure is preferably set to a value within the range of about 30 to about 50 gF. Thus, in the preferred embodiments of the present invention, the low-pressure pressing process is preferably performed in the manner described above.

In the low-pressure pressing process, the insulating coating 33b melts because the pressing tip 36 is heated at a temperature high enough to melt the insulating coating. As a result, as shown in FIG. 7b, the melted insulating coating 33b on the first electrode 34 moves to both sides of the electrically conductive wire 33a, and thus the lower side of the electrically conductive wire 33a comes into direct contact with the Sn-plated layer 34c which is the top layer of the electrode 34.

In the above low-pressure pressing process, as shown in FIG. 7b, substantially no deformation occurs in the electrically conductive wire 33a because the pressure applied by the pressing tip 36 is low enough. That is, the low-pressure pressing process is performed at a low pressure at which the electrically conductive wire 33a does not become flat.

Figure 9:
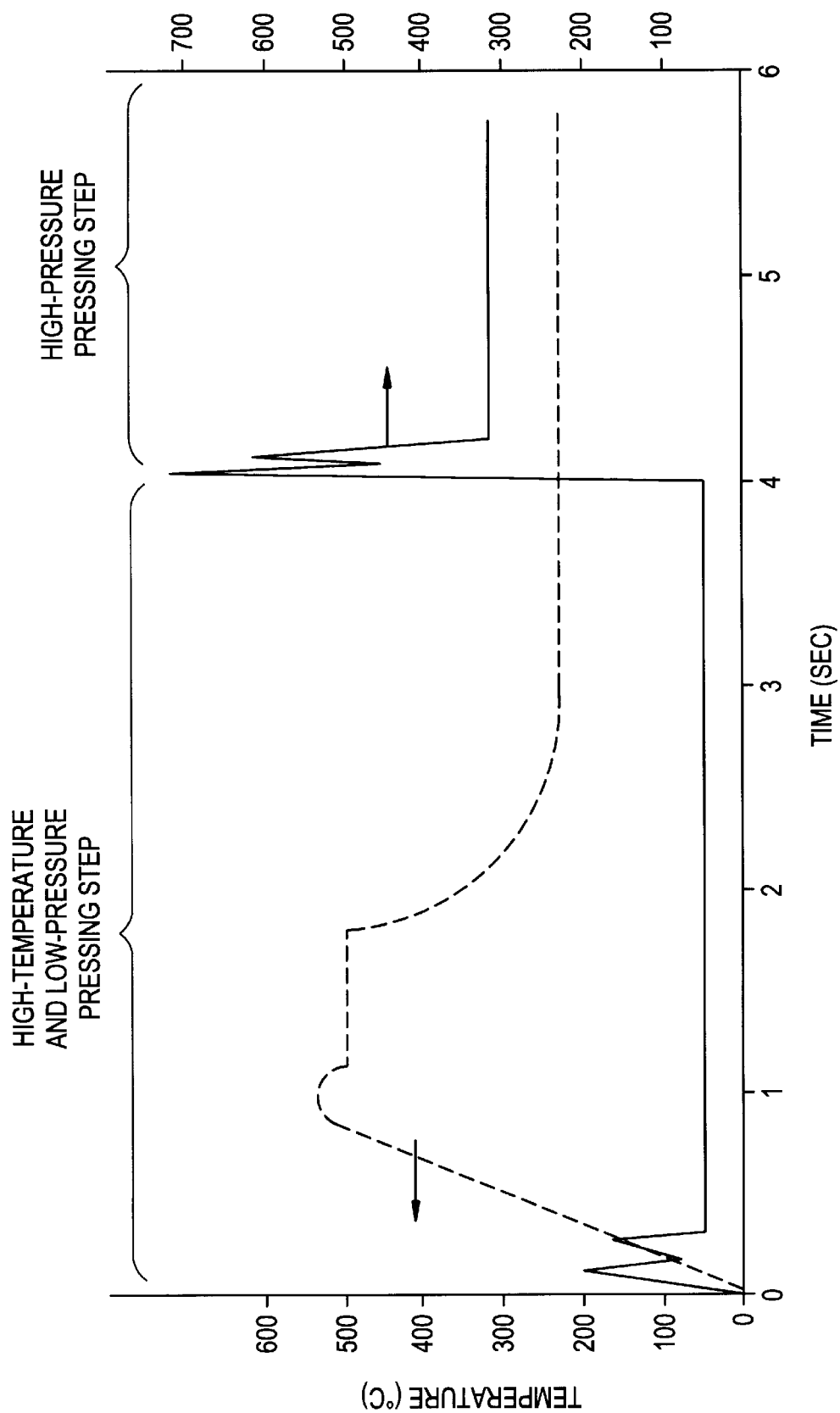
FIG. 9 is a graph illustrating the profile of the pressure and temperature applied in the preferred embodiment shown in FIG. 7.

Furthermore, in the low-pressure pressing process, because the Sn-plated layer 34c is not in direct contact with the pressing tip 36 and because the pressure applied by the pressing tip 36 is low, and because the pressing process is performed in a rather short period of time as shown in FIG. 9, the Sn-plated layer 34c is not melted although the insulating coating 33b is melted. In other words, the pressure and the pressing time are selected so that the insulating coating 33b is melted but the Sn-plated layer 34c is not melted.

Following the low-pressure pressing process, a high-pressure pressing process is performed at a relatively high pressure. In this high-pressure pressing process, the electrically conductive wire 33a is pressed against the first electrode 34 by a high enough pressure so that the electrically conductive wire 33a is flattened and embedded into the first electrode 34. The high-pressure pressing process is described in further detail below with reference to FIGS. 7c and 7d.

In the high-pressure pressing process, as shown in FIG. 7c, the pressure applied to the pressing tip 36 in a downward direction is increased so that the electrically conductive wire 33a is made flattened. That is, in the high-pressure pressing process, the pressure applied by the pressing tip 36 to the electrically conductive wire 33a is selected so that the electrically conductive wire 33a becomes flat and so that the flattened wire 33a is embedded into the first electrode 34.

Thus, in the above high-pressure pressing process, the electric wire 33a is made flat and embedded into the first electrode 34 as shown in FIG. 7d.

Preferably, the temperature in the high-pressure pressing process is set to a value lower than the melting point of the top layer of the first and second electrodes, and more specifically, lower than the melting point of the Sn-plated layer 34c, and higher than the freezing point of the Sn-plated layer 34c. In this specific preferred embodiment, the temperature is set to about 230° C. If the temperature in the high-pressure pressing process is selected within the above range, it becomes possible to make the Sn-plated layer 34c of the first electrode 34 soft enough so that the electrically conductive wire 33a is embedded into the first electrode 34.

If the temperature in the high-pressure pressing process is set to a value higher than the melting point of the Sn-plated layer 34c, then the Sn-plated layer 34c is melted during the high-pressure pressing process and melted tin is pushed aside by the insulating coating 33b. As a result, there is a possibility that some portion of the Ni-plated layer 34b is exposed or a crater is produced after the insulating coating 33b is removed.

The optimum pressure in the high-pressure pressing process depends on the diameter and the material of the electrically conductive wire 33a In an example in which the electrically conductive wire is made of Cu and has a diameter of about 40 $\mu$m, the pressure is preferably set to about 300 gF.

After completion of the high-pressure pressing process, the pressing tip 36 is moved upward. As a result, the insulating coating 33b sticking to the lower surface 36a of the pressing tip 36 is removed from the first electrode. As shown in FIG. 7d, after the insulating coating 33b is removed, the electrode 34 has a flat surface having no craters.

FIG. 9 illustrates the profile of the temperature and the pressure in the low-pressure pressing process and also in the high-pressure pressing process. As can be seen from FIG. 9, it is preferable to perform the high-pressure pressing process immediately after the low-pressure pressing process so that the electrode 34 has a flat surface after the end portion of the insulated electric wire 33 is connected to the electrode 34.

According to the production method of the present preferred embodiment, as described above, the electric wire 33a becomes flat and the flattened wire 33a is embedded into the first electrode 34. As a result, the first electrode 34 has a flat surface after the insulated electric wire 33 is connected to the first electrode 34. Therefore, the coil device can be mounted on a printed circuit board or the like in such a manner that the electrodes are connected via solder or the like to the printed circuit board in a highly reliable manner.

Furthermore, because the Sn-plated layer 34c is exposed at the area outside the electrically conductive wire 33a, excellent solderability can be achieved.

Although in the above described preferred embodiment, the high-pressure pressing process is performed at a temperature lower than the temperature used in the low-pressure pressing process, the temperature in the high-pressure pressing process may be higher than that in the low-pressure pressing process. For example, in the case where the insulating coating 33b is made of a urethane resin, the urethane resin melts at about 280° C. however the Sn-plated layer does not become soft at such a temperature. In this case, the urethane resin insulating coating is melted in the low-pressure pressing process, and the Sn-plated layer is made soft in the high-pressure pressing process by using a higher temperature in the high-pressure pressing process than the temperature in the low-pressure pressing process thereby ensuring that the electrically conductive wire is embedded into the Sn-plated layer of the first electrode, as in the preferred embodiment described above.

Although in the third preferred embodiment described above the first and second electrodes are incorporated into the multilayer structure including the base layer 34a made of the silver-filled conductive paste, the Ni-plated layer 34b, and the Sn-plated layer 34c, the first and second electrodes may also be formed to have a single layer structure.

Figure 10:
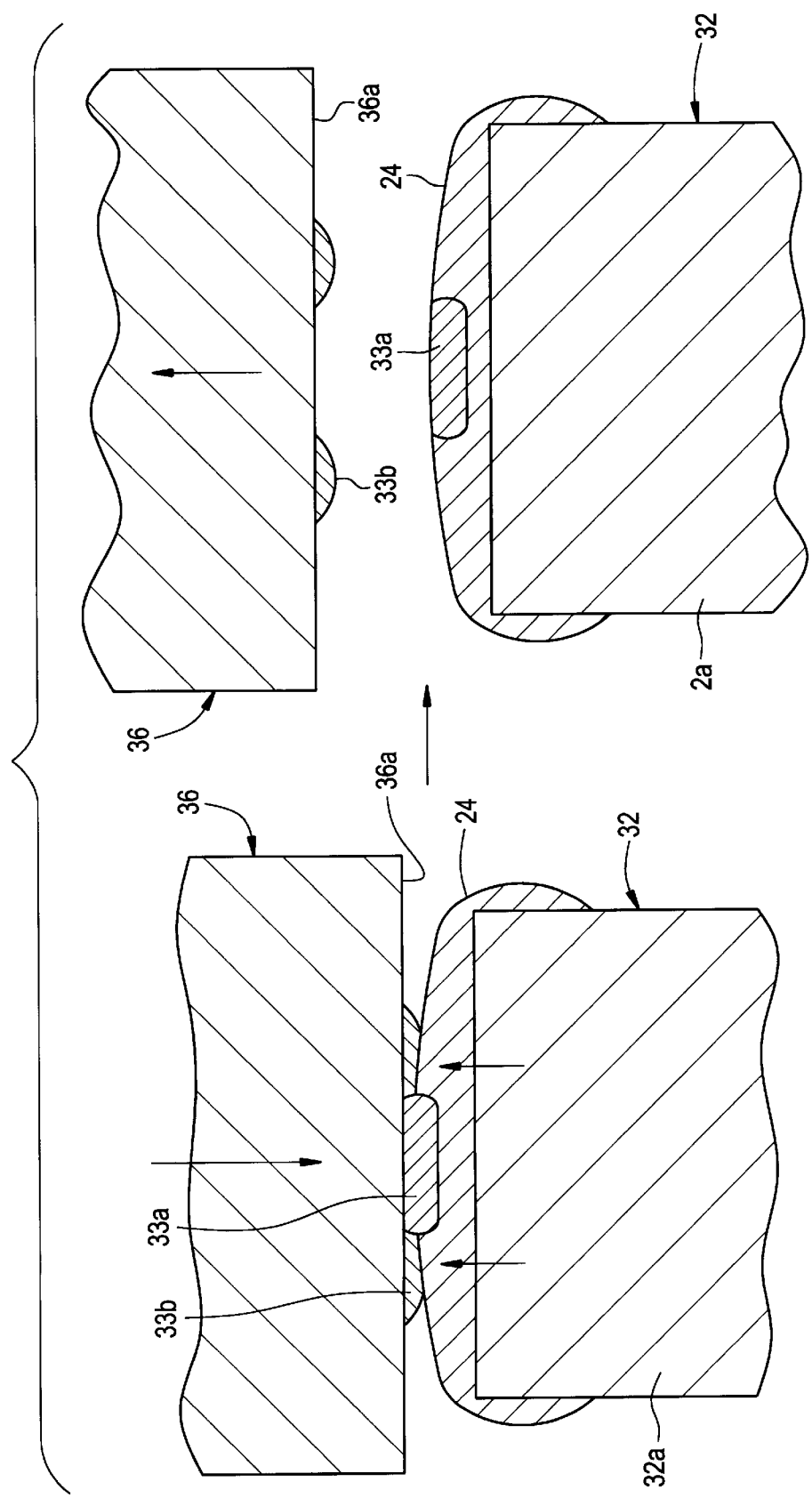
FIG. 10 is a cross-sectional view illustrating a high-pressure pressing process according to another preferred embodiment of the invention.
Figure 11:
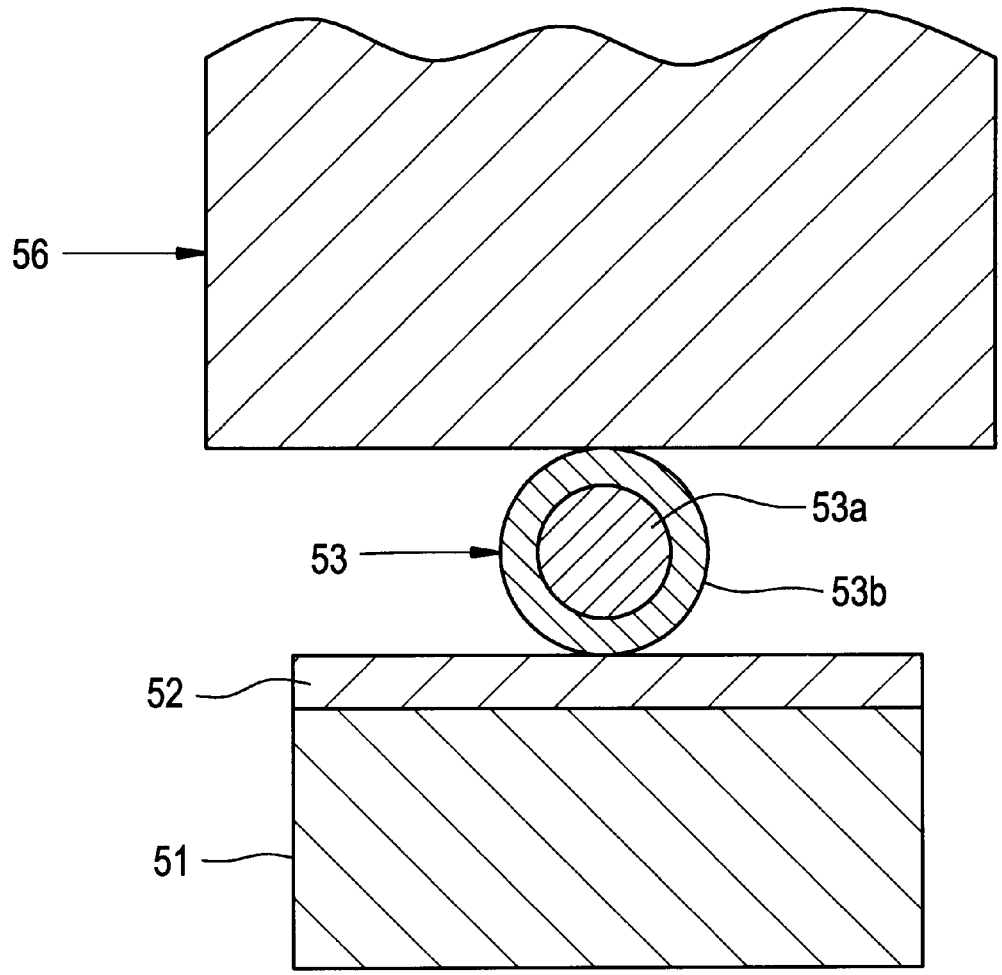
FIG. 11 is a cross-sectional view illustrating a process for connecting an insulated electric wire to an electrode according to a conventional technique.
Figure 12:
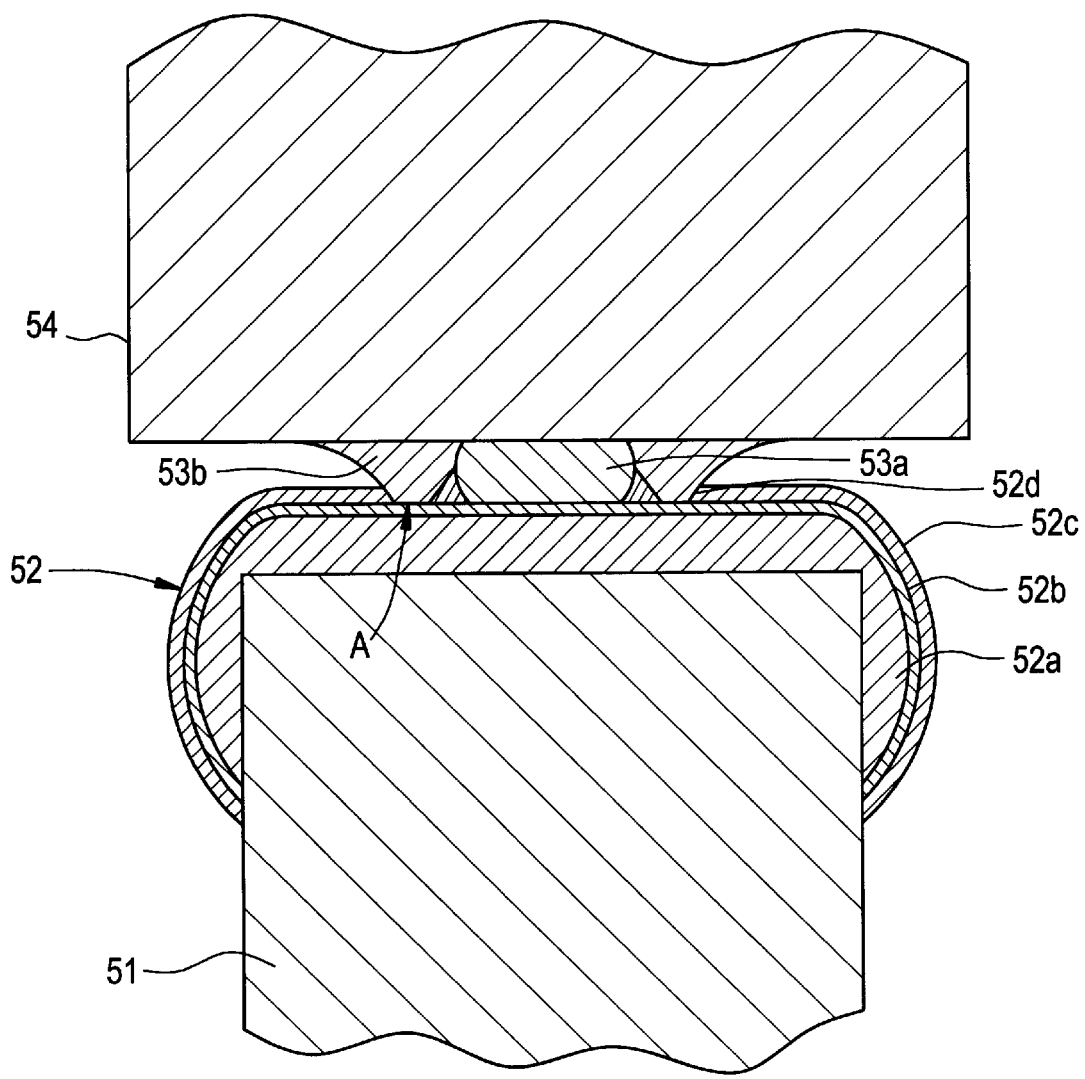
FIG. 12 is a cross-sectional view illustrating a problem which occurs when an insulated electric wire is connected to an electrode made of a metal material having a low melting point according to a conventional technique.

That is, the first and second electrodes may be formed of a single metal material and the insulated electric wire may be connected to the first and second electrodes by performing the low-pressure pressing process and the high-pressure pressing process. Also in this case, as in the case of the third preferred embodiment described above, in the low-pressure pressing process performed first, the electrically conductive wire does not become flat and the insulating coating is melted and pushed aside. Then in the high-pressure pressing process, a relatively high pressure is applied by the pressing tip 36 to the electrically conductive wire 33a so that the wire 33a is embedded into the electrode 24, as shown in FIG. 10. To ensure that the wire 33a can be embedded, it is preferable that the temperature in the high-pressure pressing process is higher than the temperature at which the first electrode 24 made of the single material becomes soft, that is, the freezing temperature, and should be lower than the melting point of the first electrode 24.

The insulating coating 33b melts and moves to the sides of the wire 33a if the low-pressure pressing process is performed first. When the pressing tip 36 is moved up after completion of the high-pressure pressing process performed after the low-pressure pressing process, the insulating coating 33b is removed because the insulating coating 33b sticks to the lower surface 36a of the pressing tip 36. Therefore, as shown on the right side of FIG. 10, after the completion of the high-pressure pressing process, the first electrode 24 has a structure in which the wire 33a is connected to the first electrode 24 in such a manner that the surface of the connecting part becomes flat.

Although in the above preferred embodiment the coil device has a structure in which a pair of electrodes are provided at both ends of the core around which the insulated electric wire 33 is wound and the both ends of the insulated electric wire 33 are connected to the respective electrodes, the present invention is also applicable to a coil device having a structure in which electrodes are disposed only at one side of a core 32 and the ends of an insulated electric wire are connected to the electrodes. Furthermore, there is no limitation on the number of electrodes to which the ends of the insulated electric wire are connected.

Although in the above-described preferred embodiment the temperature in the low-pressure pressing process is preferably set to a value at which the insulating coating 33b melts but the Sn-plated layer 34c or the low-melting-point metal layer hardly melts at all, the temperature in the low-pressure pressing process may also be set to a value at which the low-melting-point metal layer 34c melts. In the case where the temperature in the low-pressure pressing process is set to a value at which the low-melting-point metal layer 34c melts, the low-melting-point metal layer 34c may be cooled, in the following process, to a temperature higher than its freezing point so that the low-melting-point metal layer 34c is in a soft state thereby ensuring that the wire 33a is embedded into the electrode in the high-pressure pressing process, as in the above-described preferred embodiment. The cooling may be performed either during or prior to the high-pressure pressing process.

The electric wire 33a may also be made of metal other than copper. For example, Ni or Ag may be used for this purpose. Furthermore, the insulating material of the insulating coating 33b is not limited to polyesterimide or urethane resins, but other proper synthetic resins may also be used.

Although the present invention has been described above with reference to specific preferred embodiments, the invention is not limited to the details described therein. The electronic device and the production method therefor may be modified in various ways without departing from the spirit and the scope of the invention.

For example, the present invention can be applied not only to a chip coil which is designed to be mounted in a horizontal position as is the case in the first to third preferred embodiments, but also to a chip coil which is mounted in a vertical position (in which the winding axis of the coil extends in a direction substantially perpendicular to the plane on which the coil is mounted). Furthermore, instead of the magnetic core 10, a dielectric core or an insulated core made of ceramics or resin may also be used to form the insulating base structure. Still furthermore, the present invention can be applied not only to the chip coil but also to a wire-wound inductor. Furthermore, the present invention may be applied to a wide variety of electronic devices combined with other types of electric functional devices such as a capacitor.

As can be understood from the above description, the present invention has various advantages. That is, in the present invention, the electrode on the insulating base includes at least a solder barrier layer made of a material having a high melting point and an easy-soldering layer made of a material having a low melting point, and end portions of the electric wire are embedded via thermocompression process into the easy-soldering layer in such a manner that the resultant electrode structure has a substantially flat surface having no raised portions extending up from the electrode. This structure makes it possible to mount the coil device on a printed circuit board in a stable manner. In particular, if the surface of the end portions of the wire are covered with another easy-soldering layer after they are connected to the electrode, then the end portions of the electric wire are prevented from oxidation and thus, solderability is further improved.

Furthermore, in the connecting process according to preferred embodiments of the present invention, the end portions of the electric wire are pressed against the electrode while being heated so that the electric wire and the solder barrier layer are connected to each other via solid welding and the electric wire and the easy-soldering layer are connected to each other via brazing. This allows the electric wire to be connected to the electrode in a highly reliable manner. Therefore, the electronic device including such a connection has high reliability and high resistance to mechanical shocks and vibrations. Furthermore, the insulating coating of the electric wire is melted/evaporated by heat during the connecting process, and no additional process for removing the coating is necessary.

In the method of producing a coil device according to preferred embodiments of the present invention, the low-pressure pressing process is preferably performed first so that the end portions of the insulated electric wire are pressed by a relative low pressure against the electrode at a temperature high enough to melt the insulating coating thereby melting the insulating coating and moving the melted coating toward the sides of the electric wire. In the following high-pressure pressing process, a higher pressure is applied to the electric wire so that the end portions of the electric wire become flat and are embedded into the electrode. Thus, the resultant connections have a structure including a flat surface, in which the electric wire is connected to the electrodes in a highly reliable fashion. As a result, highly reliable electric connections are achieved and the coil device can be mounted on a printed circuit board or the like via soldering in a highly reliable fashion.

Still furthermore, in preferred embodiments of the present invention, the high-pressure pressing process is preferably performed at a temperature lower than the melting point of the top layer of the electrodes and higher than the freezing point thereof so that the surface of the electrodes becomes soft in the high-pressure pressing process thereby ensuring that the end portions of the electric wire are embedded into the electrodes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of producing an electronic component, comprising the steps of:

forming at least one electrode on a base, said electrode including at least a solder barrier layer made of a material having a high melting point and an easy-soldering layer made of a material having a low melting point disposed on the surface of said solder barrier layer; and pressing an electric wire against the at least one electrode while heating the electric wire and the electrode so that the electric wire and the solder barrier layer are connected together via solid welding and so that the electric wire and the easy-soldering layer are connected together via brazing.

2. A method of producing an electronic component, according to claim 1, wherein in said step of pressing the electrically conductive wire against the electrode while heating, the electrically conductive wire and the electrode are heated so that the temperature thereof increases to a value higher than the melting point of the easy-soldering layer and lower than the melting point of the solder barrier layer, and then the electrically conductive wire and the electrode are cooled so that the temperature decreases to a value lower than the melting point of the easy-soldering layer.

3. A method of producing a coil device, according to claim 2, wherein said high-pressure pressing step is performed at a temperature lower than a temperature at which said low-pressure pressing step is performed.

4. A method of producing a coil device, according to claim 2, wherein said high-pressure pressing step is performed at a temperature higher than a temperature at which said low-pressure pressing step is performed.

* * * * *